US 6,713,677 B2

(12) United States Patent
Fischbach et al.

(10) Patent No.: US 6,713,677 B2
(45) Date of Patent: Mar. 30, 2004

(54) HOUSING ASSEMBLY FOR AN ELECTRONIC DEVICE AND METHOD OF PACKAGING AN ELECTRONIC DEVICE

(75) Inventors: Reinhard Fischbach, München (DE); Manfred Fries, Hunderdorf (DE); Manfred Zaeske, Berlin (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/260,469

(22) Filed: Sep. 30, 2002

(65) Prior Publication Data

US 2003/0090007 A1 May 15, 2003

Related U.S. Application Data

(63) Continuation of application No. PCT/DE01/01165, filed on Mar. 28, 2001.

(30) Foreign Application Priority Data

Mar. 31, 2000 (DE) .......................... 100 16 135

(51) Int. Cl.⁷ .............................................. H01L 23/28
(52) U.S. Cl. ...................... 174/52.2; 174/52.4; 257/687
(58) Field of Search .................... 174/52.2, 52.3, 174/52.4; 257/678, 679, 680, 687, 704, 730, 778, 787

(56) References Cited

U.S. PATENT DOCUMENTS

| | | | | |
|---|---|---|---|---|
| 5,477,611 A | | 12/1995 | Sweis et al. .................. 29/840 |
| 5,480,842 A | * | 1/1996 | Clifton et al. .............. 438/464 |
| 5,663,106 A | | 9/1997 | Karavakis et al. ............ 29/841 |
| 5,867,368 A | * | 2/1999 | Glenn ......................... 361/783 |
| 6,015,722 A | | 1/2000 | Banks et al. ................. 438/108 |
| 6,307,258 B1 | * | 10/2001 | Crane et al. ................. 257/680 |

FOREIGN PATENT DOCUMENTS

| | | |
|---|---|---|
| DE | 297 22 093 U1 | 7/1998 |
| EP | 0 398 587 B1 | 11/1990 |
| JP | 11 354 686 | 12/1999 |

* cited by examiner

Primary Examiner—Dean A. Reichard
Assistant Examiner—Carmelo Oliva
(74) Attorney, Agent, or Firm—Laurence A. Greenberg; Werner H. Stemer; Ralph E. Locher

(57) ABSTRACT

A housing assembly forms a package for an electronic device. The housing assembly has the electronic device, an external carrier and a housing frame. A capillary-acting epoxy resin is filled into the assembled housing assembly via a filling-in opening and, on account of its capillary action, closes the interspaces between the semiconductor chip and the housing frame.

17 Claims, 2 Drawing Sheets

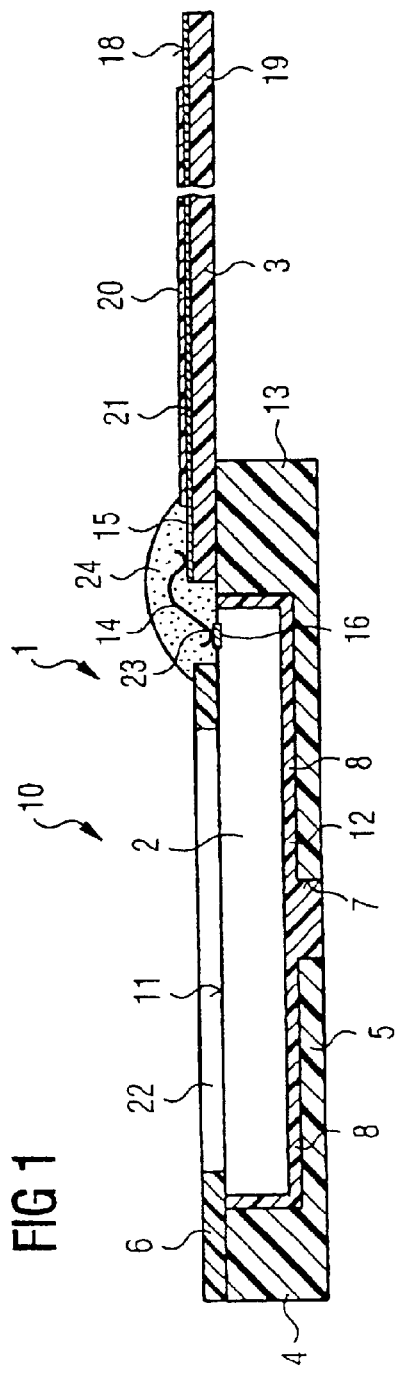
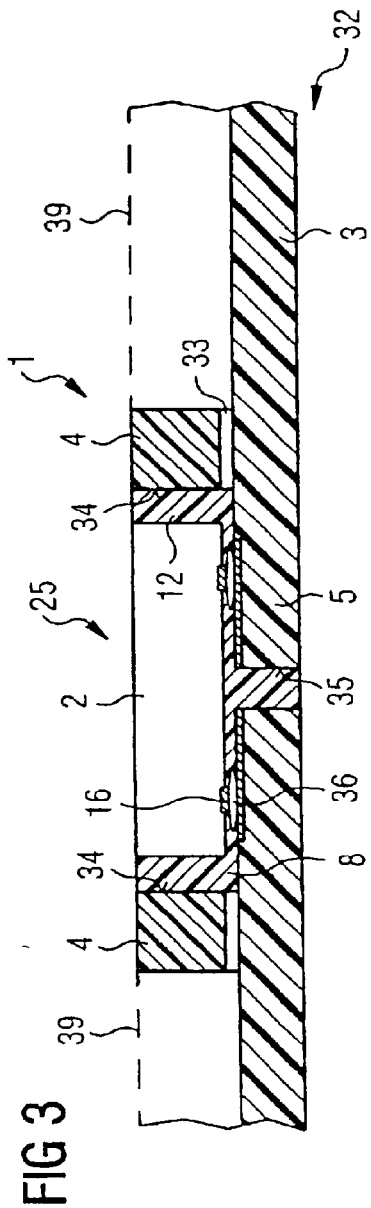

HOUSING ASSEMBLY FOR AN ELECTRONIC DEVICE AND METHOD OF PACKAGING AN ELECTRONIC DEVICE

CROSS-REFERENCE TO RELATED APPLICATION

This application is a continuation of copending International Application No. PCT/DE01/01165, filed Mar. 28, 2001, which designated the United States and which was not published in English.

BACKGROUND OF THE INVENTION

1. Field of the Invention

The invention relates to a housing assembly for an electronic device and to a method for packaging electronic devices.

In semiconductor technology, semiconductor chips are provided with a housing for protection against mechanical damage and against ambient influences by various methods. In the case of machine-mountable devices, the housing also performs functions which are crucial for the further processing and mounting. The chips are encapsulated against ambient influences with a housing made of an injection-molding compound or a housing made of ceramic or a housing made of a plastic adhesive compound, also called "Globetop" encapsulation.

The art places increasing demands for housings that are inexpensive, simple to produce and machine-mountable and can be used both in the test phase of a semiconductor chip and in the mass production phase.

2. Summary of the Invention

It is accordingly an object of the invention to provide a housing assembly for an electronic component and a packaging method which overcome the disadvantages of the heretofore-known devices and methods of this general type and which provide for a housing assembly that can be produced inexpensively compared with the prior art device packages or device encapsulations and that is compatible with the production lines existing to date.

With the foregoing and other objects in view there is provided, in accordance with the invention, a housing assembly for an electronic component, comprising:

an electronic device;

an external contact carrier connected to the electronic device;

a housing frame encasing the electronic device;

at least one covering selected from the group consisting of an underside covering part and a top-side covering part;

the electronic device, the housing frame, and the covering forming interspaces therebetween; and capillary-acting epoxy resin filled in the interspaces in a heated state via a filling-in opening, wherein the epoxy resin fills the interspaces and the interspaces are dimensioned to form capillary spaces selected from the group consisting of capillary gaps and a capillary bore.

In other words, the housing assembly for an electronic device has at least the following components:

an electronic device to be packaged (e.g. a semiconductor chip), an external contact carrier, a housing frame surrounding the semiconductor chip, and an underside covering part and/or a top-side covering part, the interspaces of the components being filled in a heated state by means of a capillary-acting epoxy resin via a filling-in opening and the interspaces being dimensioned as capillary gaps or capillary holes.

The housing assembly according to the invention has the advantage that no shaped bodies whatsoever are required in the production of the housing assembly, especially as the housing assembly already represents the outer form of the housing. At most, supporting elements are necessary which keep the housing components at a distance relative to one another during the process of filling in the capillary-acting epoxy resin. In the simplest case, such a supporting element may be a plate-type chip carrier which simultaneously has the external contacts plated-on, impressed or printed-on. The chip position, i.e. the position of the active side of a chip which has the electronic components, can be chosen completely freely in the case of this housing assembly. Thus, the active side may face upward as in the case of a fingertip module and be freely accessible or be covered by a top-side covering part, as in the case of machine-mountable housing variants.

Contact-making and connection of contact areas on the semiconductor chip to external contact areas via contact pads can be carried out by means of wire bonding on the upwardly facing active area of the semiconductor chip or, as in the so-called flip-chip technique, be provided downward to corresponding contact pads on the carrier material of the external contact carrier. Consequently, the housing assembly according to the invention is distinguished by high adaptability and high flexibility in conjunction with reduced costs for mounting and assembly.

In one embodiment of the invention, the housing assembly includes a fingertip module, i.e., a fingerprint capture module or a fingertip chip sensor. Since the fingertip module must be accessible on its top side with the active semiconductor chip area, the filling-in opening is provided for the capillary-acting epoxy resin in the underside covering part. Therefore, during production, the housing assembly is positioned with the underside covering part pointing upward for the purpose of filling in the capillary-acting epoxy resin.

In a further embodiment of the invention, the underside covering part of a housing assembly for the fingertip module may include an integral edge covering. This has the advantage that the two components required, namely the external contact carrier and the housing frame, are in one piece and form a unit and, consequently, do not have to be adjusted with respect to one another during assembly.

In a further embodiment of the invention, the gap between the underside covering part of the housing assembly of a fingertip module and the semiconductor chip and between the integral edge covering and the semiconductor chip is adapted to the capillary action of the epoxy resin. This capillary action has the consequence that the uniform distribution of the capillary-acting epoxy resin in the gap is stopped if the gap exceeds a critical size. This property of a capillary-acting epoxy resin has the advantage that no additional measures whatsoever are required in order to seal capillary-acting gaps or capillary-acting holes which open toward the outer side of the housing assembly against escape of the epoxy resin.

In a further embodiment of the invention, the fingertip module has bonding connections between contact pads of the external contact carrier and contact areas on the semiconductor chip. These bonding connections can be fitted after the fixing of the chip with the aid of the capillary-acting epoxy resin to the top side of the semiconductor chip, on the contact areas arranged there, in order to connect the latter to the contact pads of the external contact carrier. To that end, the contact areas on the semiconductor chip are arranged in an edge region of the semiconductor chip which can be sealed after the introduction of the bonding connections by means of a thermoplastic potting compound with inclusion of the bonding connections.

In a further embodiment, the external contact carrier of the fingertip module is a flexible multilayer conductor strip having flat conductors which are arranged between the contact pads and external contact areas on a flexible substrate and are partly covered by an insulation layer. This embodiment has the advantage that the external contact carrier can be adapted to the spatial requirements of the place where the fingertip module is used. Moreover, it becomes possible to form the external contact carrier as flexible multilayer conductor strip in a machine mounting installation as continuous conveying strip on which the housing assembly according to the invention is to be arranged and fixed. To that end, the flexible multilayer conductor strip has corresponding openings which permit access to the active semiconductor area of the fingertip module.

In a further embodiment of the invention, the housing assembly includes a smart card module. In this embodiment, the semiconductor chip is arranged on the external contact carrier using flip-chip technology, the external contact carrier simultaneously forming the underside covering part of the smart card module and carrying both the external contact areas and the contact pads. To that end, the contact pads are arranged in a pattern which corresponds to the pattern of the contact areas on the semiconductor chip, so that the contact bumps of the semiconductor chip can be connected to the contact pads of the external contact carrier by means of flip-chip technology.

In a further embodiment of the housing assembly, the latter has a machine-mountable housing. To that end, the top-side covering part is equipped with a filling-in opening and control holes. The dimensions of the control holes are adapted to the capillary action of the epoxy resin, so that the control holes can be used to ascertain whether all the cavities between the semiconductor chip and the housing assembly are filled with capillary-acting epoxy resin. This housing assembly has the advantage that even cavities with larger dimensions than a capillary gap can be filled with the capillary-acting epoxy resin in a controlled manner, especially as the control holes are arranged in the top-side covering part and communicate with the housing assembly cavities to be filled. In order thus to ensure that the cavities are filled, at least one control hole is provided in the top-side covering part for each cavity to be filled.

With the above and other objects in view there is also provided, in accordance with the invention, a method of packaging an electronic device in a housing assembly, which comprises the following method steps:

providing a plurality of components of the housing assembly, including an electronic device to be packaged, an external contact carrier, and a housing frame;

assembling the components of the housing assembly, and orienting the housing frame such that a filling-in opening for a capillary-acting epoxy resin is at a top thereof;

heating the components to a temperature in a range from 85 to 95° C.;

filling capillary-acting epoxy resin into the filling-in opening, causing the epoxy resin to propagate into voids selected from the group consisting of capillary gaps and capillary bores;

polymerizing the epoxy resin; and curing the epoxy resin.

In other words, the method for packaging electronic devices having at least a semiconductor chip to be packaged, an external contact carrier and a housing frame has the following method steps:

a) assembling of the components so that the filling-in opening provided for a capillary-acting epoxy resin lies at the top, b) heating of the components to a temperature in the range from 85 to 95° C., c) filling of the capillary-acting epoxy resin into the filling-in opening of the housing assembly with the propagation of the epoxy resin into the capillary gaps and/or capillary holes, d) polymerization of the epoxy resin, e) curing of the epoxy resin.

This method has the advantage that housing assemblies can be sealed without having to employ a complicated plastic injection-molding technique or complicated ceramic composite construction techniques. In the case of this method, it is possible to dispense with the sealing of outwardly leading gaps and holes as long as they have dimensions according to the invention which are adapted to the capillary action of the epoxy resin. In the case of the method, the epoxy resin runs only to the extent that the capillary action of the epoxy resin is active, so that the propagation of the epoxy resin stops at edges at which the capillary gap or the capillary holes increase in size. Nevertheless, this method can be used to fill larger cavities of the package assembly with the epoxy resin if provision is made of corresponding filling-in openings to the cavities which are not closed by capillary action of the epoxy resin, and, on the other hand, control openings are provided which have capillary action and thus indicate if the cavity provided is completely filled with the epoxy resin. To that end, such control openings are to be arranged in each case at the topmost point of the cavities.

Consequently, in the case of the novel method, despite outwardly leading control openings and capillary gaps, escape does not occur and it is possible, in an inexpensive manner, to seal a prefabricated housing assembly, which is not restricted in its geometry, for a semiconductor chip. Furthermore, this method makes it possible to minimize the device height whilst simultaneously increasing the device stability, so that this method can advantageously be used to assemble housing assemblies for smart cards and fingertip sensors and also for machine mounting.

The so-called "underfillers", which can be used for other method steps, can be used as capillary-acting epoxy resin. In a preferred implementation of the method, for assembling the components of the housing assembly, the latter is fixed on a flexible chip carrier. Such a flexible chip carrier may simultaneously form the external contact carrier, so that the external contact carrier of the housing assembly may be designed for machine mounting.

In an exemplary implementation of the method, the housing assembly is fixed to the chip carrier with heating, a thermoplastic used as hot melt adhesive being melted. Upon cooling, the thermoelastic plastic adhesively bonds the housing assembly on the chip carrier, thereby advantageously enabling mass production.

In another implementation of the method, the housing assembly is fixed on the chip carrier by means of a two-component adhesive. To that end, adjusting elements are provided which position the components of the housing assembly exactly with respect to one another.

In a further implementation of the method, the housing assembly is fixed on the chip carrier by means of an adhesive film. This method is particularly suitable for packaging fingertip modules, especially as after the filling of the fingertip module and the production of the bonding connections for the fingertip module, the latter can be separated from the adhesive film on the chip carrier, especially as the chip carrier with adhesive film merely serves for assembling the housing assembly and is not part of the packaged electronic device in the case of such an implementation of the method.

Other features which are considered as characteristic for the invention are set forth in the appended claims.

Although the invention is illustrated and described herein as embodied in a housing assembly for an electronic device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a diagrammatic cross section through a housing assembly for a fingertip module according to a first embodiment of the invention;

FIG. 3 is a diagrammatic cross section through a housing assembly for a smart card module according to a second embodiment of the invention.

DESCRIPTION OF THE PREFERRED EMBODIMENTS

Figure 2:
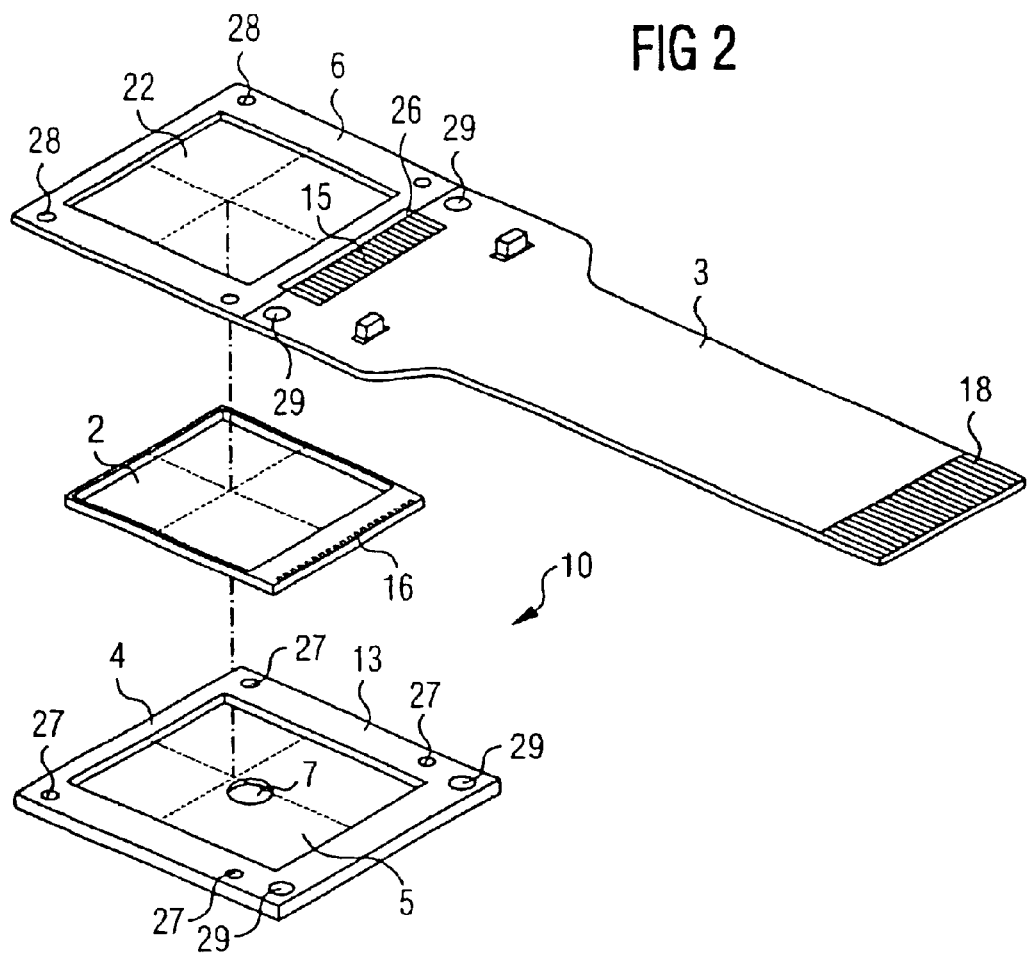
FIG. 2 is an exploded perspective view of the housing assembly of FIG. 1.

Referring now to the figures of the drawing in detail and first, particularly, to FIG. 1 thereof, there is shown a diagrammatic cross section through a housing assembly for a fingertip module 10, also referred to as a fingerprint module 10, according to a first embodiment of the invention. The housing assembly of FIG. 1 for an electronic device 1 essentially comprises a semiconductor chip 2 to be packaged, i.e., a so-called fingertip chip sensor 2, an external contact carrier 3 and a housing frame 4, which in this embodiment is integrally connected to an underside covering part 5.

The housing frame 4 and the underside covering part 5 are adapted to the dimensions of the semiconductor chip 2 to be incorporated in such a way that they remain between the housing frame 4 and the semiconductor chip 2 and also between the underside covering part 5 and the semiconductor chip 2 gap cross-sections whose dimensions are coordinated with the capillary action of a capillary-acting epoxy resin 12 that is to be filled in. Gaps that are dimensioned in this way are called capillary gaps 8 hereinafter. In this embodiment, a filling-in opening 7 for the capillary-acting epoxy resin is provided in the underside covering part 5. A so-called "underfiller" is used as capillary-acting epoxy resin.

In order to fill in the capillary-acting epoxy resin through the filling-in opening 7, firstly the housing assembly is arranged with the underside covering part 5 toward the top on a carrier which has an adhesive film and exhibits corresponding openings in the region of the bonding connections 14 that are later to be introduced. A top-side covering 6 is dimensioned in such a way that it has an opening 22 which exposes the active area of the fingertip module 10. Furthermore, the top-side covering 6 is delimited in such a way that contact areas 16 for a bonding connection 14 are uncovered, said contact areas being situated in the edge region of the semiconductor chip 2. A bonding wire 23 of the bonding connection 14 in each case connects a contact area 16 on the semiconductor chip to a contact pad 15 on the external contact carrier 3 which is connected to an external contact area 18 via a flat conductor 21. The region of the bonding connections 14 is filled by an epoxy resin 24 and protected against mechanical damage and ambient influences. The external contact carrier 3 is in multilayer form and has a flexible substrate 19 connected to an edge covering 13 for the semiconductor chip 2. The flexible substrate 19 carries the contact pads 15, the flat conductors 21 and the external contact areas 18 and also an insulating layer 20, which protects the flat conductors 21.

FIG. 2 shows an exploded perspective view of the housing assembly of FIG. 1. In the embodiment shown in FIG. 2, the external contact carrier 3 forms a unit with the top-side covering part 6 and has, in the region of the top-side covering part 6, the opening 22 which opens to the active surface of the semiconductor chip 2 of a fingertip module 10. A second opening 26 in the external contact carrier 3 and the top-side covering part 6 enables access to the contact areas 16 of the semiconductor chip 2 and to the contact pads 15 of the external contact carrier 3, as long as the second opening 26 is not covered or sealed by an epoxy resin. The semiconductor chip 2 can be fitted into the edge covering 13 except for lateral capillary gaps. The underside covering part 5 is integrally connected to the edge covering 13 and has, in its center, a filling-in opening 7 for the capillary-acting epoxy resin. Four corner holes 27 in the edge covering 13 correspond to corresponding corner holes 28 in the top-side covering part 6 and serve for fixing the fingertip module 10 in or on corresponding electronic devices.

Two further holes in the edge covering 13 corresponding to corresponding holes 31 in the external contact carrier 3. These holes 29 and 31 are also provided for the positioning and fixing of the finished fingertip module 10. The opening 26 is sealed after the production of the bonding connection between the contact areas 16 on the semiconductor chip 2 and the contact pads 15 on the external conduct carrier 3 with a plastic adhesive compound, e.g. an epoxy resin 24.

FIG. 3 shows a diagrammatic cross section through a housing assembly for a smart card module 25 according to a second embodiment of the invention. This housing assembly comprises a housing frame 4, which is fixed on a smart card 32 as external contact carrier 3. The connecting gap 33 between housing frame 4 and smart card 32 can be filled with capillary-acting epoxy resin 12. The interspace 34 between housing frame 4 and semiconductor chip 2 can be dimensioned as capillary-active gap or be formed as filling-in opening without any capillary action and thus have a larger distance between housing frame 4 and semiconductor chip 2 than a capillary gap. In the case where the space between housing frame 4 and semiconductor chip 2 is provided as filling-in opening or filling-in gap, the gap 35 in the smart card base must be dimensioned such that it is adapted to the capillary action of the epoxy resin, so that the capillary-active epoxy resin 12 can be filled in from above between the housing frame 4 and the semiconductor chip 2, without emerging from the gap 35 in the smart card base.

The semiconductor chip 2 is arranged in a flip-chip configuration on the smart card 32, which is simultaneously formed as external contact carrier 3 in the region of the semiconductor chip. Within the housing frame 4, the external contact carrier 3 has a pattern of contact pads which correspond to a pattern of contact areas 16 on the semiconductor chip 2. Between the contact areas 16 and the contact pads on the external contact carrier 3, the electrical connection is produced via soldering bumps 36, for example, the semiconductor chip 2 being electrically contact-connected on the smart card 32 before the positioning of the housing frame 4 and the capillary-acting epoxy resin 12 then being filled in. The gap 35 serves as insulation gap between a multiplicity of the contact pads on the external contact carrier 3.

In order to realize the flattest possible design for a smart card module, a preformed top-side covering part is not provided, rather only a thin resist layer is required for protecting the underside of the semiconductor chip. The smart card 32 can also have a cutout in the region of the housing assembly, so that a separate housing frame 4 is not necessary. On the other hand, the diagrammatic construction of a housing assembly as shown in FIG. 3 can be constructed in such a way that the entire assembly with external contact areas on the underside of the external contact carrier 3 is incorporated into a smart card of corresponding thickness. This embodiment is indicated by dashed contour lines 39 in FIG. 3.

Figure 4:
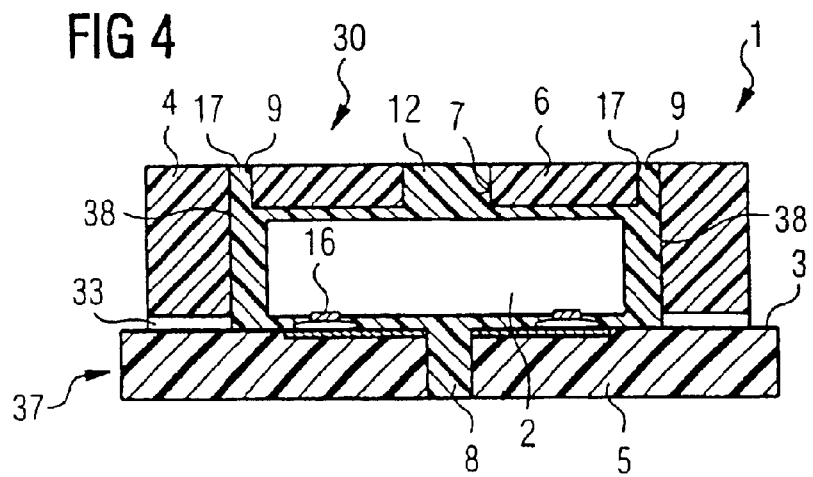
FIG. 4 is a diagrammatic cross section through a housing assembly for a machine-mountable housing according to a third embodiment of the invention.

FIG. 4 shows a diagrammatic cross section through a housing assembly for a machine-mountable housing according to a third embodiment of the invention. This machine-mountable housing is arranged as housing assembly on an external contact carrier 3, which simultaneously represents a chip carrier 37 for a large number of machine-mountable housings. The chip carrier 37 can be realized in the form of a flexible strip or in the form of a circuit board, which carry the external contact areas and the contact pads.

Firstly, the semiconductor chips 2 are applied on the chip carrier 37, which has various and a plurality of external contact carrier regions for a plurality of semiconductor chips 2, using flip-chip technology, so that contact areas 16 of the semiconductor chips 2 are connected to contact pads of the external contact carrier 3. Afterward, the housing frame 4 and a top-side covering part 6 are emplaced. The capillary gap 8 in the chip carrier 37 serves for insulating the contact pads from one another and has dimensions which are adapted to the capillary action of the epoxy resin 12. The same applies to the distance between the semiconductor chip 2 and the external contact carrier 3. The space between the housing frame 4 and the semiconductor chip 2 can be dimensioned as desired, since the top-side covering part 6 has control holes 17 adapted to the capillary action of the epoxy resin 12.

As soon as the cavity 38 between the housing frame 4 and the semiconductor chip 2 is filled with capillary-active epoxy resin, the control holes 17 are automatically filled with epoxy resin on account of the capillary action and thus indicate that the cavities 38 are completely filled. The filling-in opening 7 must accordingly be larger than a capillary opening and permit a filling-in channel to the cavity 38, without the inflow of epoxy resin to the cavity 38 being stopped by capillary action. This can be realized for example by means of a filling-in opening 7 which is like an elongated hole and is arranged transversely above the semiconductor chip 2, or by means of an opening 7 in the topside covering part 6, which opening is arranged outside the center in the region of the cavity 38. From such an opening, thin-viscose, heated, capillary-acting epoxy resin flows into the opening and propagates in the capillary gaps 8 and correspondingly dimensioned control holes 17, so that the filling-in process is ended after a few seconds.

On account of the capillary forces which are active in the gap 8 in the external contact carrier 3 or in the chip carrier 37, no epoxy resin can escape from the capillary gap 8. Consequently, no sealing measures whatsoever are required and a connecting gap 33 between housing frame 4 and external contact carrier 3 can also be formed as a capillary gap, so that a mechanical connection between the chip carrier 37 and the housing frame 4 is also produced at the same time as the filling-in of the epoxy resin, without epoxy resin being able to propagate on the chip carrier through the connecting gap 33. Accordingly, this housing assembly has the advantage that no shaped parts whatsoever in addition to the components of the housing assembly are required for sealing or packaging a semiconductor chip.

We claim:

1. A housing assembly, comprising:
   a fingertip module including a semiconductor chip formed with a sensor area;
   an external contact carrier connected to said fingertip module;
   a housing frame encasing said fingertip module;
   an underside covering part formed with a filling-in opening;
   said fingertip module, said housing frame, and said underside covering part forming interspaces therebetween; and
   capillary-acting epoxy resin filled in said interspaces in a heated state via said filling-in opening, said epoxy resin filling said interspaces and said interspaces being dimensioned to form capillary gaps.

2. The housing assembly according to claim 1, wherein said underside covering part includes an integral edge covering.

3. The housing assembly according to claim 2, wherein a gap between said underside covering part and said semiconductor chip and a gap between said edge covering and said semiconductor chip is adapted to a capillary action of said capillary-acting epoxy resin.

4. The housing assembly according to claim 1, wherein said fingertip module is formed with contact areas and said external contact carrier is formed with contact pads, and bonding connections connect said contact pads of said external contact carrier with said contact areas on said fingertip module.

5. The housing assembly according to claim 1, wherein said contact areas are formed on a semiconductor chip forming a part of said fingertip module, and said bonding connections are bonding wires.

6. The housing assembly according to claim 1, wherein said housing frame forms a part of a machine-mountable housing.

7. The housing assembly according to claim 6, wherein said machine-mountable housing includes a top-side covering part and said top-side covering part is formed with said filling-in opening and with control bores.

8. The housing assembly according to claim 7, wherein said control bores have dimensions adapted to a capillary action of said capillary-acting epoxy resin.

9. The housing assembly according to claim 6, wherein said semiconductor chip is disposed in a flip-chip position in said machine-mountable housing.

10. A housing assembly comprising:

an electronic device formed with contact areas;

an external contact carrier formed with contact pads, said external contact carrier connected to said electronic device, said external contact carrier forming a part of said electronic device and being formed by a flexible multilayer conductor strip having flat conductors arranged between said contact pads and external contact areas on a flexible substrate, and wherein an insulation layer partly covering said flat conductors;

a housing frame encasing said electronic device;

an underside covering part formed with a filling-in opening;

said electronic device, said housing frame, and said underside covering part forming interspaces therebetween; and capillary-acting epoxy resin filled in said interspaces in a heated state via said filling-in opening, said epoxy resin filling said interspaces and said interspaces being dimensioned to form capillary gaps.

11. The housing assembly according to claim 10, wherein said electronic device is a smart card module.

12. A method of packaging an electronic device in a housing assembly, which comprises the following method steps:

providing a plurality of components of the housing assembly, including an electronic device to be packaged, an external contact carrier, and a housing frame with a covering;

assembling the components of the housing assembly, and orienting the housing frame such that a filling-in opening for a capillary-acting epoxy resin is at a top thereof;

heating the components to a temperature in a range from 85 to 95° C.;

filling capillary-acting epoxy resin into the filling-in opening, causing the epoxy resin to propagate into interspaces formed between the electronic device to be packaged, the housing frame, and the covering, forming capillary gaps polymerizing the epoxy resin; and curing the epoxy resin.

13. The method according to claim 12, which comprises fixing the housing assembly to a flexible chip carrier for assembling the components.

14. The method according to claim 13, wherein the flexible chip carrier forms the external contact carrier.

15. The method according to claim 13, wherein the step of fixing the housing assembly to the chip carrier comprises heating the chip carrier to melt a thermoplastic forming a hot melt adhesive.

16. The method according to claim 13, wherein the fixing step comprises fixing the housing assembly on the chip carrier with a two-component adhesive.

17. The method according to claim 13, wherein the fixing step comprises fixing the housing assembly on the chip carrier with an adhesive film.

* * * * *